(12) United States Patent
Fukuda et al.

(10) Patent No.: US 11,956,900 B2
(45) Date of Patent: Apr. 9, 2024

(54) ELECTRONIC CONTROL UNIT AND METHOD FOR ASSEMBLING ELECTRONIC CONTROL UNIT

(71) Applicant: Hitachi Astemo, Ltd., Hitachinaka (JP)

(72) Inventors: Tomohiro Fukuda, Hitachinaka (JP); Yoshiaki Mizuhashi, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 204 days.

(21) Appl. No.: 17/435,961

(22) PCT Filed: Dec. 24, 2019

(86) PCT No.: PCT/JP2019/050495
§ 371 (c)(1),
(2) Date: Sep. 2, 2021

(87) PCT Pub. No.: WO2020/188934
PCT Pub. Date: Sep. 24, 2020

(65) Prior Publication Data
US 2022/0159838 A1    May 19, 2022

(30) Foreign Application Priority Data
Mar. 19, 2019   (JP) .................................. 2019-050819

(51) Int. Cl.
*H05K 1/14* (2006.01)
*H05K 1/11* (2006.01)
(Continued)

(52) U.S. Cl.
CPC .............. *H05K 1/144* (2013.01); *H05K 1/115* (2013.01); *H05K 1/184* (2013.01); *H05K 3/306* (2013.01);
(Continued)

(58) Field of Classification Search
CPC ........ H05K 1/115; H05K 1/144; H05K 1/184; H05K 2201/042; H05K 2201/1003; H05K 2201/10053; H05K 2201/10151
See application file for complete search history.

(56) References Cited

U.S. PATENT DOCUMENTS

2013/0257193 A1* 10/2013 Toda ..................... H02K 5/10
                                                    310/52
2015/0274197 A1   10/2015 Saito et al.
(Continued)

FOREIGN PATENT DOCUMENTS

JP    2015-193371 A   11/2015
JP    2016-36244 A     3/2016
(Continued)

OTHER PUBLICATIONS

International Search Report (PCT/ISA/210) issued in PCT Application No. PCT/JP2019/050495 dated Apr. 7, 2020 with English translation (four (4) pages).
(Continued)

*Primary Examiner* — Paresh Paghadal
(74) *Attorney, Agent, or Firm* — Crowell & Moring LLP

(57) ABSTRACT

An object of the present invention is to improve the component mounting efficiency. An electronic control unit of the present invention includes: a power board 23 that includes a first insertion hole portion R1A having a plurality of holes 23Aa-2U, 23Aa-2V, and 23Aa-2W through which a coil wire of a first system is inserted and a second insertion hole portion R2A having a plurality of holes 23Aa-2U, 23Aa-2V, and 23Aa-2W through which a coil wire of a second system is inserted; a control board 25 provided on an upper part of the power board 23; and a board-to-board connector 105 that electrically connects the power board 23 and the control board 25. The first insertion hole portion R1A and the second insertion hole portion R2A are collectively arranged on the same side of the power board 23.

7 Claims, 8 Drawing Sheets

(51) Int. Cl.
  *H05K 1/18*    (2006.01)
  *H05K 3/30*    (2006.01)
  *H05K 3/36*    (2006.01)
(52) U.S. Cl.
  CPC ......... *H05K 3/36* (2013.01); *H05K 2201/042* (2013.01); *H05K 2201/1003* (2013.01); *H05K 2201/10053* (2013.01); *H05K 2201/10151* (2013.01)

(56) References Cited

U.S. PATENT DOCUMENTS

| | | |
|---|---|---|
| 2016/0036289 A1 | 2/2016 | Kawata et al. |
| 2017/0133905 A1 | 5/2017 | Nakamura et al. |
| 2018/0093698 A1 | 4/2018 | Urimoto et al. |
| 2019/0103787 A1* | 4/2019 | Maeshima ........... B62D 5/0406 |
| 2019/0140520 A1* | 5/2019 | Sato ....................... H02K 11/33 |
| 2020/0172154 A1* | 6/2020 | Hattori ................. B62D 5/0406 |

FOREIGN PATENT DOCUMENTS

| | | |
|---|---|---|
| WO | WO 2016/002687 A1 | 1/2016 |
| WO | WO 2017/068636 A1 | 4/2017 |

OTHER PUBLICATIONS

Japanese-language Written Opinion (PCT/ISA/237) issued in PCT Application No. PCT/JP2019/050495 dated Apr. 7, 2020 (five (5) pages).

\* cited by examiner

ELECTRONIC CONTROL UNIT AND METHOD FOR ASSEMBLING ELECTRONIC CONTROL UNIT

TECHNICAL FIELD

The present invention relates to an electronic control unit suitable for being provided in an electric power steering device and a method for assembling the same.

BACKGROUND ART

As a background art in this technical field, a drive device for an electric power steering device described in JP 2016-36244A (PTL 1) is known.

In the drive device of PTL 1, a substrate 41 is provided on one side of a motor. First switching elements (SW elements) to 56 are arranged on a heat generation element mounting surface 42. Second switching elements (SW elements) 61 to 66 are arranged on a surface, which is the same as a surface of the substrate 41 on which the first switching elements 51 to 56 are arranged in a second region R2 which is a region opposite to a first region R1 in which the first switching elements 51 to 56 are arranged with an axial center O of a motor 10 therebetween. A first motor line 135 is taken out from a first winding group for each phase and arranged on the substrate 41, and a second motor line 145 is taken out from a second winding group for each phase and arranged on the substrate 41. The first motor line 135 and the first switching elements 51 to 56 and the second motor line 145 and the second switching elements 61 to 66 have opposite phase arrangements from an electric power supply region Rin side. As a result, variations of wiring lengths among phases from the electric power supply region Rin are reduced. See the summary above. Note that the above reference signs which are the same as those described in PTL 1 have been directly described, but are irrelevant to reference signs in the present specification and the drawings.

CITATION LIST

Patent Literature

PTL 1: JP 2016-36244 A

SUMMARY OF INVENTION

Technical Problem

In the drive device of PTL 1, the first motor line and the first switching element and the second motor line and the second switching element are arranged in the regions opposite to each other with the axial center of the motor therebetween. The first motor line and the first switching element are preferably arranged at close positions, and the second motor line and the second switching element are preferably arranged at close positions. Further, the first switching element and the second switching element are heat generation elements, and thus, it is preferable to bring a back surface side (surface opposite to the heat generation element mounting surface) of the substrate in the first region where the first switching element is arranged and the second region where the second switching element is arranged into contact with a frame member (referred to as a basic substance in the present specification) to enhance a heat radiation effect from the substrate to the frame member. In this case, it is difficult to mount a component on the back surface side of the substrate in the first region and the second region.

It is preferable to effectively utilize the back surface side of the substrate as a component mounting surface in order for miniaturization of a device. In this case, when the first motor line and the first switching element, and the second motor line and the second switching element are arranged in the regions opposite to each other with the axial center of the motor therebetween as in the drive device of PTL 1, contact portions between the substrate and the frame member are dispersedly arranged, and the component mounting efficiency on the back surface side of the substrate is lowered.

An object of the present invention is to improve the component mounting efficiency.

Solution to Problem

In order to achieve the above object, an electronic control unit of the present invention includes: a power board that includes a first insertion hole portion having a plurality of holes through which a coil wire of a first system is inserted and a second insertion hole portion having a plurality of holes through which a coil wire of a second system is inserted; a control board provided on an upper part of the power board; and a board-to-board connector that electrically connects the power board and the control board. The first insertion hole portion and the second insertion hole portion are collectively arranged on the same side of the power board.

ADVANTAGEOUS EFFECTS OF INVENTION

According to the present invention, heat generating components can be integrated, and a back surface side of the power board can be effectively utilized, and thus, the component mounting efficiency can be improved. Other objects, configurations, and effects which have not been described above become apparent from embodiments to be described hereinafter.

DESCRIPTION OF EMBODIMENTS

An embodiment of the present invention will be described with reference to drawings. Note that there is a case where a description is given by specifying an up-down direction and a left-right direction in the following description, but these up-down direction and left-right direction are based on an up-down direction and a left-right direction illustrated in FIGS. 2 to 5 and 8, and do not necessarily match an up-down direction and a left-right direction in a device mounting state.

Figure 1:
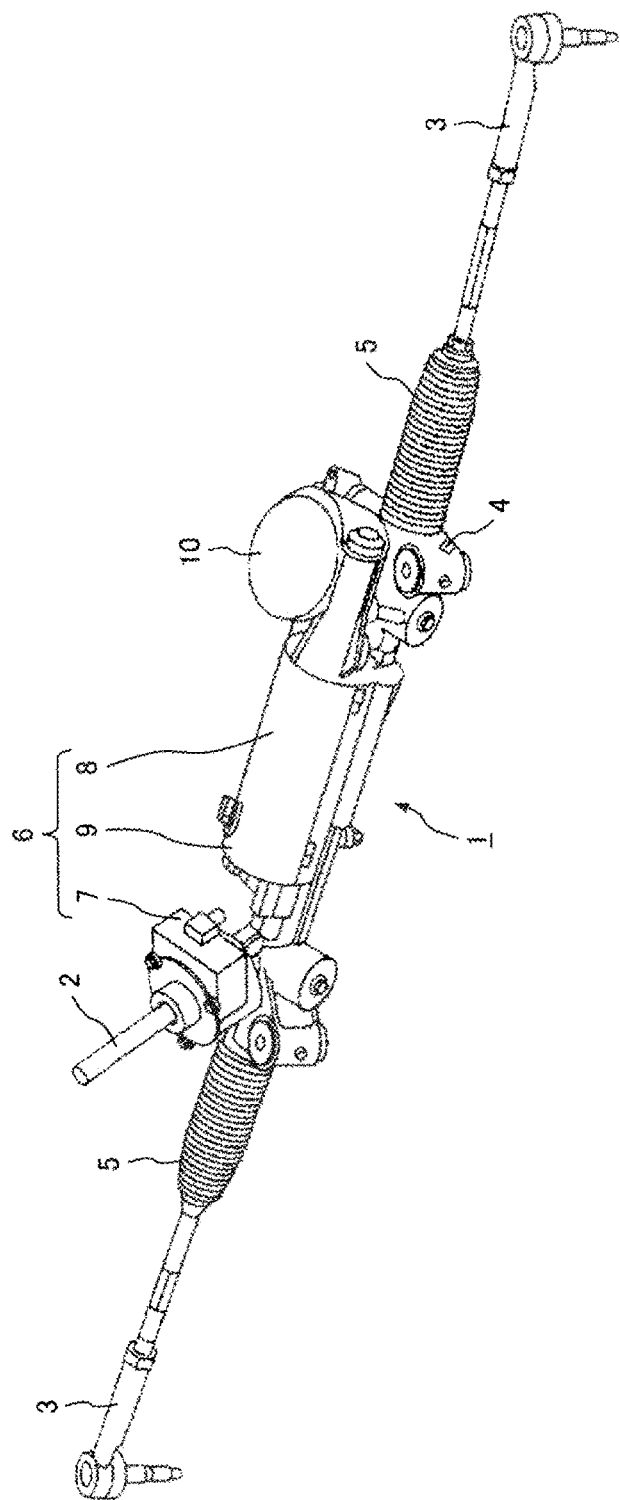
FIG. 1 is an overall perspective view of an electric power steering device according to an embodiment of the present invention.

FIG. 1 is an overall perspective view of an electric power steering device 1 as an example to which the present invention is applied.

The electric power steering device 1 is a device configured to steer wheels (usually front wheels) of an automobile and is configured as illustrated in FIG. 1. A pinion (not illustrated) is provided at a lower end of a steering shaft 2 connected to a steering wheel (not illustrated), and this pinion meshes with a rack (not illustrated) that is long in the left-right direction of a vehicle body. Tie rods 3 configured to steer the front wheels in the left-right direction are connected to both ends of the rack, and the rack is covered with a rack housing 4. Then, a rubber boot 5 is provided between the rack housing 4 and the tie rod 3.

An electric drive device 6 is provided to assist a torque when rotating the steering wheel. The electric drive device 6 includes: a torque sensor 7 that detects a rotation direction and a rotation torque of the steering shaft 2; an electric motor unit 8 that applies a steering assist force to the rack via a gear 10 based on detected values of the torque sensor 7; and an electronic control unit (ECU) 9 that controls an electric motor arranged in the electric motor unit 8. The electric motor unit 8 of the electric drive device 6 is connected to the gear 10 with bolts (not illustrated) at a plurality of locations on an outer peripheral portion on an output shaft side, and is provided with an electronic control unit 9 at an end of the electric motor unit 8 on a side opposite to the output shaft side. Note that there is also a case where the torque sensor 7 is configured separately from the electric drive device 6.

In the electric drive device 6, when the steering shaft 2 is rotated in any direction with the operation of the steering wheel, the torque sensor 7 detects the rotation direction and the rotation torque of the steering shaft 2, and the electronic control unit 9 calculates a drive operation amount of an electric motor based on such detected values. The electric motor is driven by a switching element 101 of a power board (inverter board or power conversion board) 23 (see FIG. 2) based on this calculated drive operation amount, and an output shaft of the electric motor is rotated so as to drive the steering shaft 2 in the same direction as an operating direction. The rotation of the output shaft is transmitted from the pinion (not illustrated) to the rack (not illustrated) via the gear 10 so that the automobile is steered. Since these configurations and effects are already well known, further descriptions thereof will be omitted.

Figure 2:
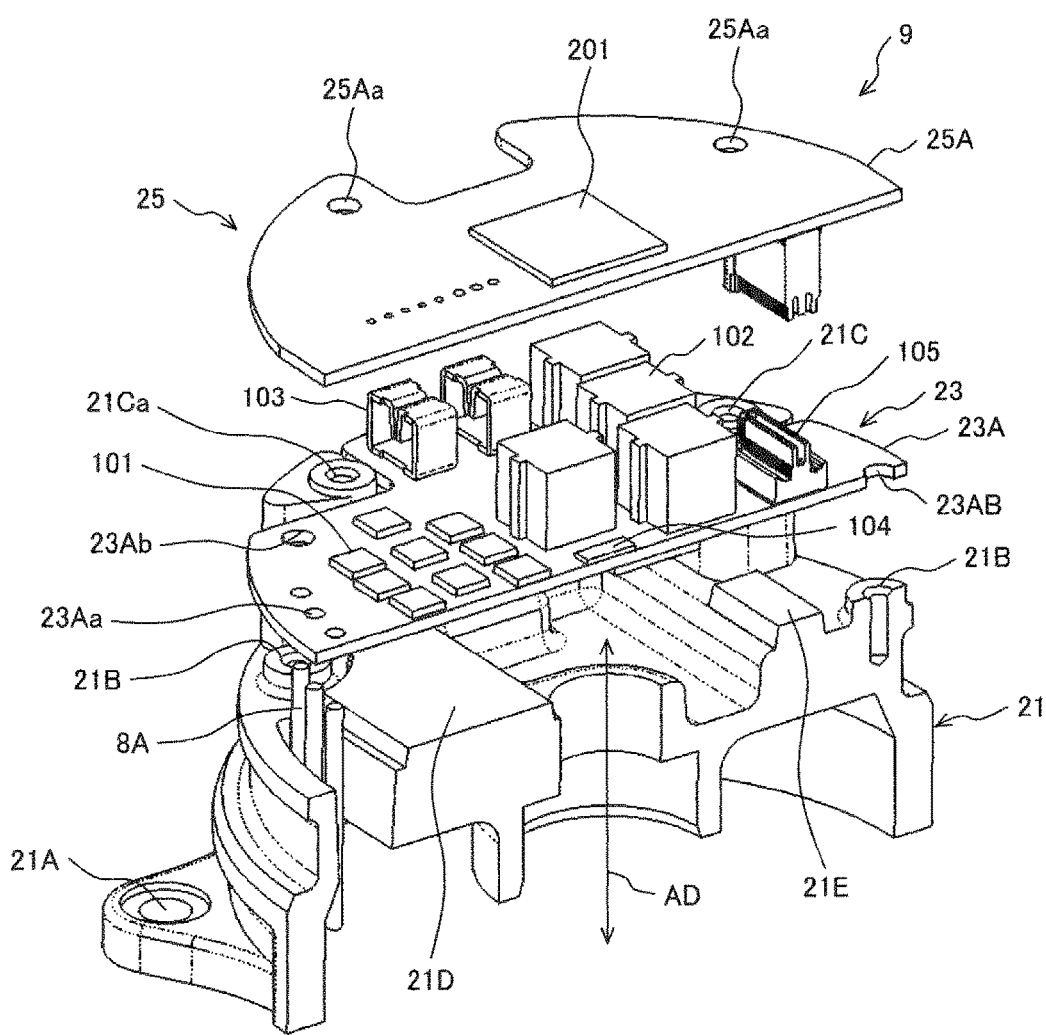
FIG. 2 is an exploded perspective view including a cross section of an electronic control unit of the electric power steering device according to the embodiment of the present invention.
Figure 3:
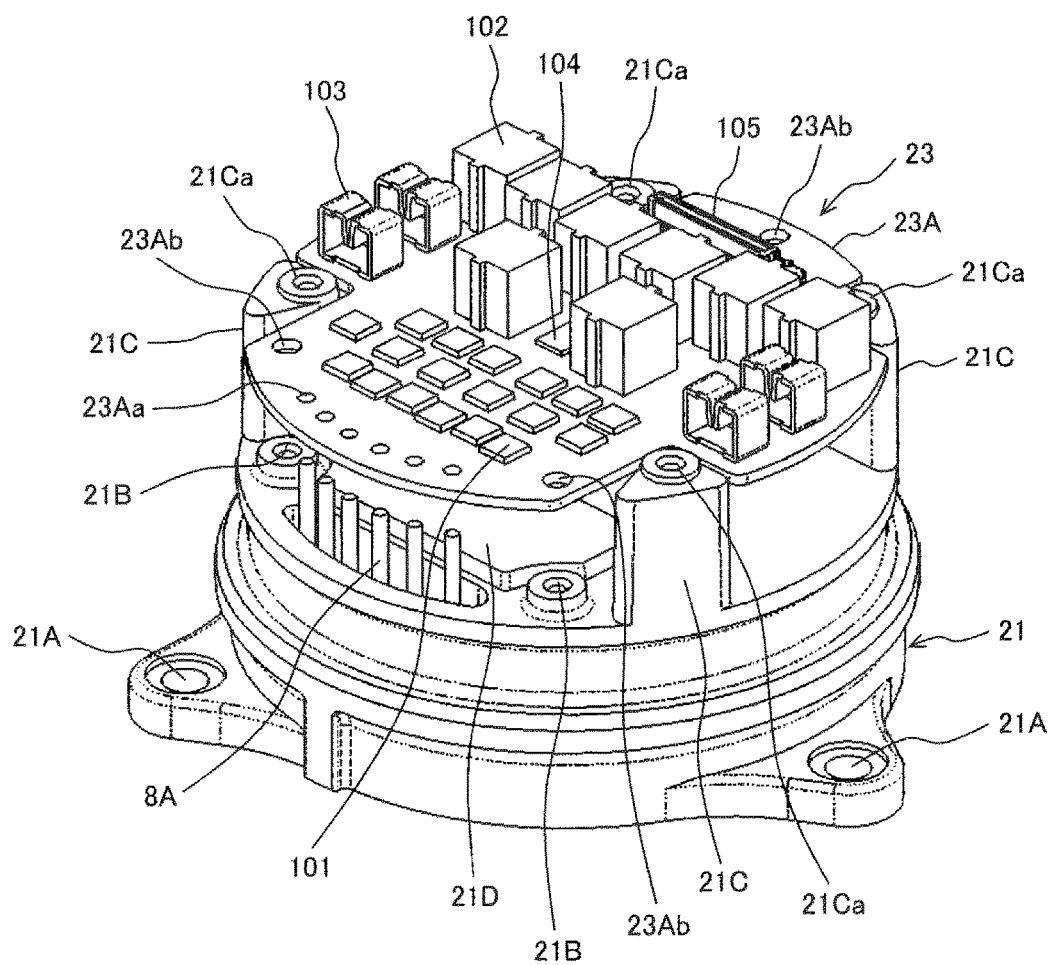
FIG. 3 is a perspective view of the electronic control unit obtained by excluding a control board from FIG. 2.

FIG. 2 is an exploded perspective view including a cross section of the electronic control unit 9 of the electric power steering device 1 according to the embodiment of the present invention. FIG. 3 is a perspective view of the electronic control unit 9 obtained by excluding the control board 25 from FIG. 2. Note that a cover covering the power board 23 and a control board 25 is not illustrated in FIG. 2.

The electronic control unit 9 is fixed to one end of the electric motor along an axial direction AD of a rotary shaft (output shaft) (the end on the side opposite to the output shaft side). In the present embodiment, the axial direction AD is defined with the rotary shaft (output shaft) of the electric motor as a reference, and a direction of the rotary shaft along the axial direction AD will be simply referred to as the axial direction in the following description.

As illustrated in FIG. 2, the electronic control unit 9 includes a basic substance 21 and the power board 23 and the control board 25 fixed to the basic substance 21. In the electronic control unit 9, the basic substance 21 is fixed to a motor housing (not illustrated) of the electric motor unit 8. The basic substance 21 and the motor housing are manufactured using an aluminum alloy or the like. The power board 23 and the control board 25 are stacked in the axial direction AD, and the power board 23 is arranged on the basic substance 21 side (lower side) with respect to the control board 25. That is, the control board 25 is arranged on the side (upper side) opposite to the basic substance 21 side with respect to the power board 23.

A coil lead wire (coil input terminal) 8A of the electric motor provided in the electric motor unit 8 penetrates the basic substance 21, is led out to an upper surface side (the side opposite to the basic substance 21 side) of the power board 23, and is electrically connected to an output terminal of the switching element 101 of the power board 23. For this purpose, a board member (power board member) 23A of the power board 23 is provided with a through-hole 23Aa, and the coil input terminal 8A is inserted through the through-hole 23Aa and led out to the upper surface side of the power board 23. The coil input terminal 8A is soldered to the board member 23A and electrically connected to the power board 23.

Note that fusing (thermal caulking), TIG welding, press-fitting, or the like may be used without being limited to soldering.

In the present embodiment, the above-described coil lead wire (coil input terminal) 8A will be treated as a part of a coil, and will be simply referred to as the coil.

The switching element 101, a capacitor 102, a power terminal 103, a magnetic sensor 104, a board-to-board connector 105, an FS relay/power choke coil 106 (see FIG. 5), and the like are arranged on the power board 23, and these electrical and electronic components form a power supply circuit (power conversion circuit). The switching element 101 converts a DC power supply into a three-phase AC power supply. The capacitor 102 is configured using an aluminum electrolytic capacitor or the like, and suppresses a voltage variation such as switching noise by charging and discharging. The power terminal 103 is a terminal to which an external power supply is connected. The magnetic sensor 104 is a sensor that detects a rotation angle of the electric motor. The board-to-board connector 105 is a circuit component that makes an electrical connection with the control board 25. An FS relay of the FS relay/power choke coil 106 is a circuit component that cuts off a current flowing through the electric motor in the event of a failure, and a power choke coil is a circuit component that suppresses the propagation of switching noise.

Figure 4:
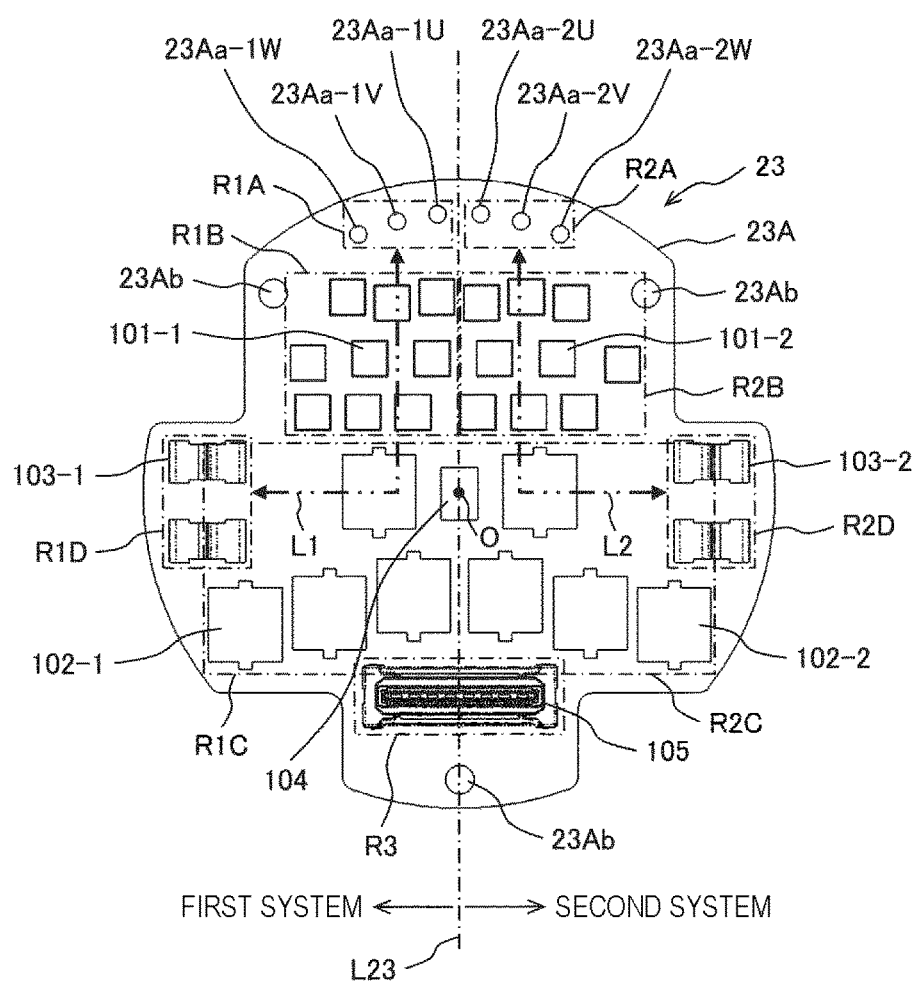
FIG. 4 is a plan view illustrating a switching element mounting surface of a power board.

FIG. 4 is a plan view illustrating a switching element mounting surface of the power board 23.

In the present embodiment, two systems are provided as a coil of the electric motor unit 8 and a drive circuit including the switching element 101, the capacitor 102, and the power terminal 103. When it is necessary to distinguish between the two systems, each component will be described with numbering such as "first" and "second".

A position that a center of the rotary shaft (axial center) of the electric motor faces is indicated by O. In the present embodiment, the first system and the second system are separately arranged on the left and right sides of a straight line L23 with the straight line L23, which passes through the axial center position O and is parallel to a component mounting surface of the board 23, as a boundary. Note that the left side of the straight line L23 is referred to as the first system, and the right side thereof is referred to as the second system.

The power board member 23A of the power board (inverter board or power conversion board) 23 includes: a first insertion hole portion R1A having a plurality of holes (through-holes or coil lead wire insertion holes) 23Aa-1U, 23Aa-1V, and 23Aa-1W through which the coil lead wire 8A (on a side to which power is supplied) of the first system is inserted; and a second insertion hole portion R2A having a plurality of holes (through-holes or coil lead wire insertion holes) 23Aa-2U, 23Aa-2V, and 23Aa-2W through which the coil lead wire 8A (on a side to which power is supplied) of the second system is inserted.

The control board 25 is provided on the upper side of the power board 23 (the side opposite to the basic substance 21 side), and the power board 23 and the control board 25 are electrically connected by board-to-board connectors 105 and 202. For this purpose, the power board 23 is provided with the board-to-board connector 105, and the control board 25 is provided with the board-to-board connector 202. Note that the control board 25 is provided with an integrated circuit 201 or the like configured to calculate a control signal for controlling the electric motor.

The first insertion hole portion R1A and the second insertion hole portion R2A are collectively arranged on the same side of the power board 23 with respect to the axial center position O in a direction along the straight line L23. That is, the first insertion hole portion R1A and the second insertion hole portion R2A are arranged so as to be integrated on the same side with respect to the axial center position O in the direction along the straight line L23. In this case, the first insertion hole portion R1A and the second insertion hole portion R2A are arranged on an outer peripheral edge portion of the power board 23, and the six holes formed of the first holes 23Aa-2U, 23Aa-2V, and 23Aa-2W of the first system and the second holes 23Aa-2U, 23Aa-2V, and 23Aa-2W of the second system are arranged at equal intervals. In the present embodiment, the six holes are arranged in an arc shape, but may be arranged in a linear shape.

On the power board 23, first coil lead wires 8A-1U, 8A-1V, and 8A-1W (see FIG. 7), a first switching element 101-1, a first capacitor 102-1, and a first power terminal 103-1 are mounted. The first insertion hole portion R1A to which the first coil lead wires 8A-1U, 8A-1V, and 8A-1W are connected, a first switching element mounting portion R1B where the first switching element 101-1 is arranged, a first capacitor mounting portion R1C where the first capacitor 102-1 is arranged, and a first power terminal mounting portion R1D where the first power terminal 103-1 is arranged are arranged along an L-shaped straight line segment L1 from the first insertion hole portion R1A side to the first power terminal mounting portion R1D side in an order of the first insertion hole portion R1A, the first switching element mounting portion R1B, the first capacitor mounting portion R1C, and the first power terminal mounting portion R1D.

Further, on the power board 23, second coil lead wires 8A-2U, 8A-2V, and 8A-2W (see FIG. 7), a second switching element 101-2, a second capacitor 102-2, and a second power terminal 103-2 are mounted. The second insertion hole portion R2A to which the second coil lead wires 8A-2U, 8A-2V, and 8A-2W is connected, a second switching element mounting portion R2B where the second switching element 101-2 is arranged, a second capacitor mounting portion R2C where the second capacitor 102-2 is arranged, and a second power terminal mounting portion R2D where the second power terminal 103-2 is arranged are arranged along an L-shaped straight line segment L2 from the second insertion hole portion R2A side to the second power terminal mounting portion R2D side in an order of the second insertion hole portion R2A, the second switching element mounting portion R2B, the second capacitor mounting portion R2C, and the second power terminal mounting portion R2D.

The first insertion hole portion R1A, the first switching element mounting portion R1B, the first capacitor mounting portion R1C, and the first power terminal mounting portion R1D in the first system, and the second insertion hole portion R2A, the second switching element mounting portion R2B, the second capacitor mounting portion R2C, and the second power terminal mounting portion R2D in the second system are arranged line-symmetrically with respect to the straight line L23.

The magnetic sensor 104 is arranged at the axial center position O. The board-to-board connector 105 is arranged on a side opposite to the first insertion hole portion R1A and the second insertion hole portion R2A with the axial center position O therebetween. Therefore, the magnetic sensor 104 is arranged between the first insertion hole portion R1A and the second insertion hole portion R2A, and a board-to-board connector mounting portion R3.

Since the first coil lead wires 8A-1U, 8A-1V, and 8A-1W and the second coil lead wires 8A-2U, 8A-2V, and 8A-2W of the two systems are collectively arranged in the same row, the assembly equipment is downsized, and the wiring efficiency is improved, so that it is possible to improve the mounting efficiency and to reduce a board size. Further, since the first coil lead wires 8A-1U, 8A-1V, and 8A-1W and the second coil lead wires 8A-2U, 8A-2V, and 8A-2W of the two systems are collectively arranged in the same row, an arrangement of the switching element 101 and the capacitor 102 can be optimized, and a product size can be reduced.

Figure 5:
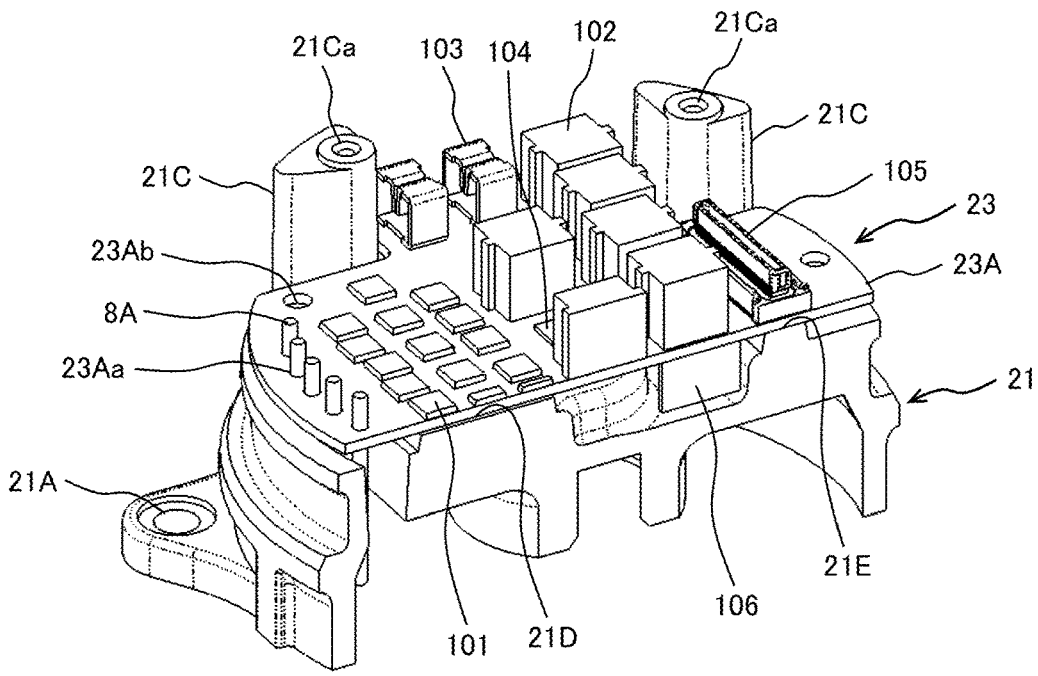
FIG. 5 is a perspective view including a cross section illustrating a state where the power board is assembled to a basic substance.

FIG. 5 is a perspective view including a cross section illustrating a state where the power board 23 is assembled to the basic substance 21.

In order to shorten a wiring, it is preferable to arrange the first coil lead wires 8A-1U, 8A-1V, and 8A-1W and the first switching element 101-1 at close positions, and it is preferable to arrange the second coil lead wires 8A-2U, 8A-2V, and 8A-2W and the second switching element 101-2 at close positions. Further, the first switching element 101-1 and the second switching element 101-2 are heat generation elements, and thus, it is preferable to bring a back surface side (a surface on a side opposite to a heat generation element mounting surface) of the first switching element mounting portion R1B and the second switching element mounting portion R2B on the power board 23 into contact with the basic substance 21 and to enhance a heat radiation effect from the power board 23 to the basic substance 21.

Therefore, in the present embodiment, the basic substance 21 is provided with a convex portion 21D protruding to the power board 23 side as illustrated in FIGS. 2 and 5 such that an upper end surface of the convex portion 21D is brought into contact with the back surface of the power board 23. In this case, it is difficult to mount a component on the back surface side of the first switching element mounting portion R1B and the second switching element mounting portion R2B on the power board 23.

Therefore, in the present embodiment, the first coil lead wires 8A-1U, 8A-1V, and 8A-1W and the second coil lead wires 8A-2U, 8A-2V, and 8A-2W are collectively arranged in the same row so that the first switching element 101-1 and the second switching element 101-2 are arranged in an integrated manner. That is, the first switching element 101-1 and the second switching element 101-2 are mounted on the upper surface of the power board 23 collectively at one location. If the first switching element mounting portion R1B and the second switching element mounting portion R2B are arranged apart from each other, a range of the convex portion 21D increases, and the component mounting surface on the back surface side of the power board 23 decreases. In the present embodiment, the convex portion 21D on which the back surface side of the first switching element mounting portion R1B and the second switching element mounting portion R2B on the power board 23 abuts can be made compact, and a space lost by the protrusion 21D can be reduced. Further, in the case where the first switching element mounting portion R1B and the second switching element mounting portion R2B are arranged apart from each other, if the convex portion 21D is divided, the component mounting surface on the back surface side of the power board 23 is divided, and the component mounting efficiency is lowered. In the present embodiment, it is possible to prevent the component mounting surface from being divided. As a result, the component mounting efficiency on the back surface side of the power board 23 is improved in the present embodiment.

In the present embodiment, high heat generating components such as the switching element 101 are mounted on the upper surface of the power board 23, low heat generating components such as the FS relay/power choke coil 106 are mounted on a lower surface of the power board 23, and only the components that require cooling are mounted on the upper surface, so that the board mounting efficiency can be improved.

Further, no electronic component is mounted on the back side of the switching element 101, so that the basic substance (casing) 21 and the power board 23 can be brought into contact with each other, and the cooling effect can be improved. Through the integration of the switching element (MOSFET) 101, a cooling portion of an aluminum housing structure forming the basic substance (casing) 21 can be simplified, which makes it possible to reduce the product size.

Note that the basic substance 21 is fixed to the motor housing (not illustrated) with bolts (not illustrated). For this purpose, a plurality of bolt insertion holes 21A through which the bolts are inserted are provided on the outer periphery of the basic substance 21 on the motor housing side. Further, the basic substance 21 is also a member that also serves as a heat sink that radiates heat generated by the switching element 101 and the like of the power board 23 as described above. For this purpose, the basic substance 21 is provided with the convex portion 21D. That is, the basic substance 21 has a first convex portion 21D that comes into contact with a part of the back surface of the power board 23 that is located directly below a mounting portion on which the high heat generating components including the switching element 101 are mounted. In order to ensure the contact between the power board 23 and the convex portion 21D, the basic substance 21 is provided with a plurality of power board fixing portions 21B that fix the power board 23 next to the convex portion 21D (see FIG. 3). A screw (not illustrated) is inserted through a through-hole 23Ab of the power board 23, and the power board 23 is screwed to the power board fixing portion 21B.

Note that a screw (not illustrated) is inserted through a through-hole 25Aa of the control board 25, and the control board 25 is screwed to a fixing portion (control board fixing portion) 21Ca provided on the basic substance 21. Since the control board 25 is arranged to be stacked on apart from the upper side of the power board 23, the control board fixing portion 21Ca is provided on an upper end surface of a columnar portion 21C extended to a position higher than the upper end surface of the convex portion 21D so as to be higher than the power board fixing portion 21B.

Figure 6A:
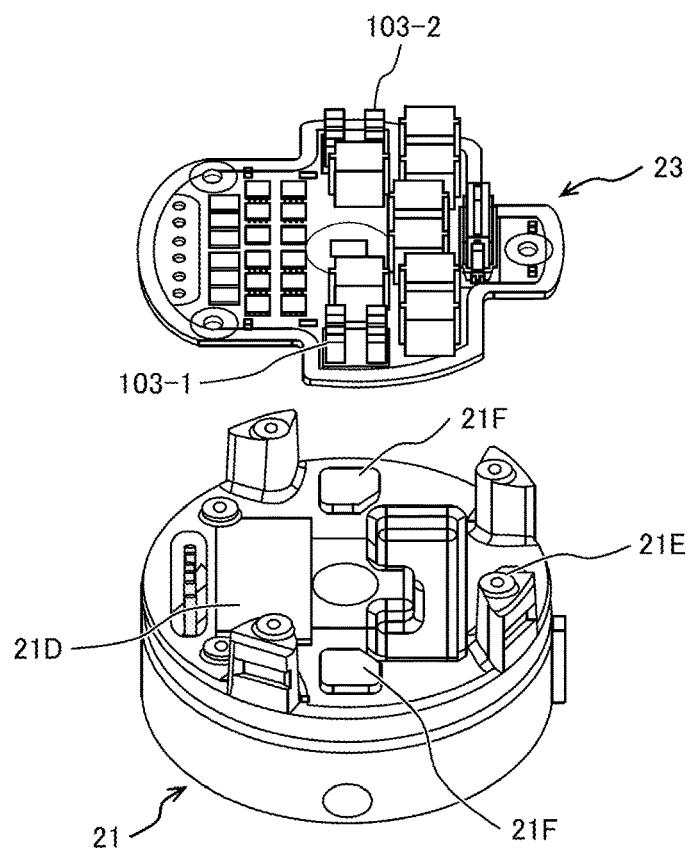
FIG. 6A is a perspective view illustrating an anti-deflection structure of the power board.
Figure 6B:
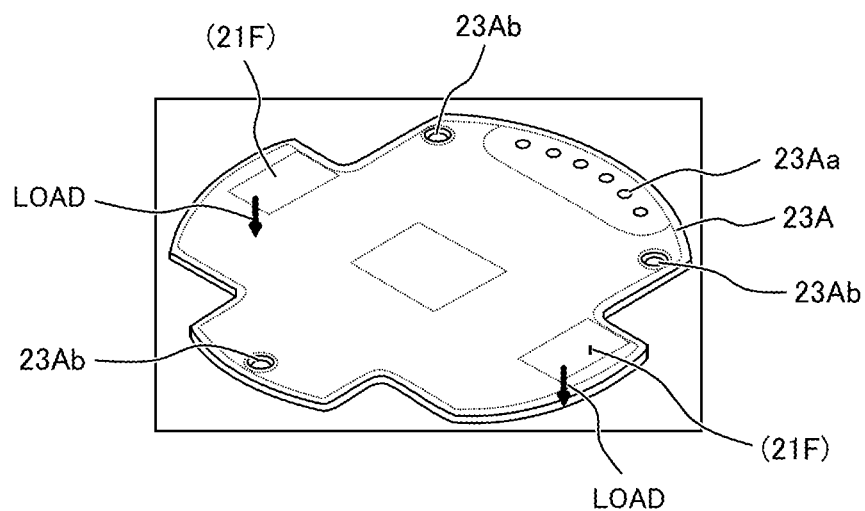
FIG. 6B is a perspective view of the power board illustrating an arrangement of the anti-deflection structure and a load input position in analysis of a deflection amount.
Figure 6C:
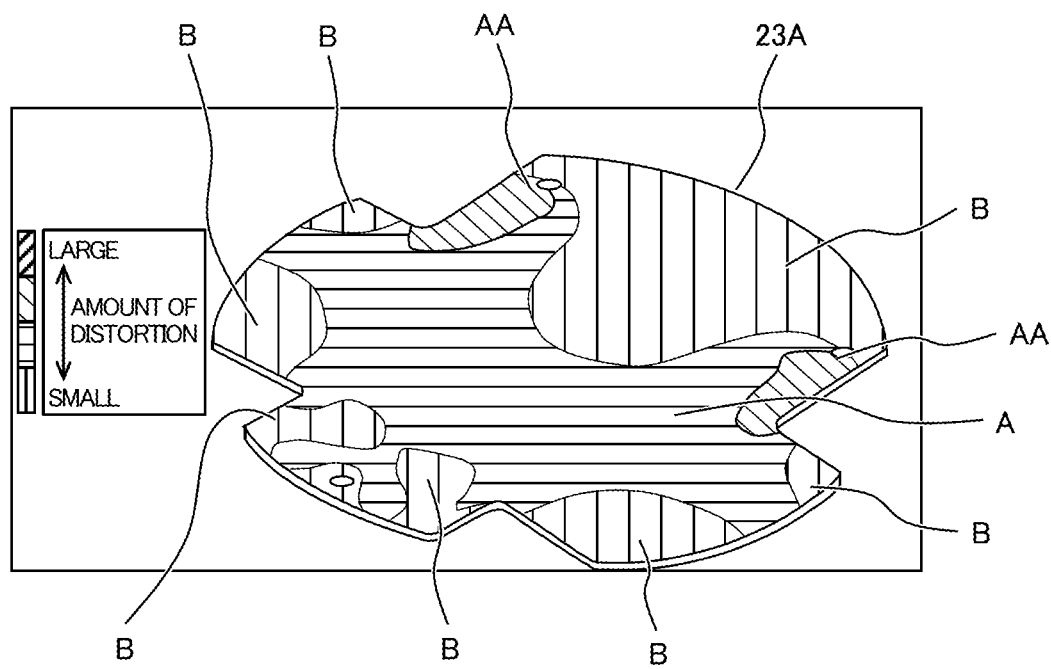
FIG. 6C is a perspective view of the power board illustrating an analysis result of the deflection amount when the anti-deflection structure is provided.

FIG. 6A is a perspective view illustrating an anti-deflection structure of the power board. FIG. 6B is a perspective view of the power board illustrating an arrangement of the anti-deflection structure and a load input position in analysis of a deflection amount. FIG. 6C is a perspective view of the power board illustrating an analysis result of the deflection amount when the anti-deflection structure is provided.

Figure 6D:
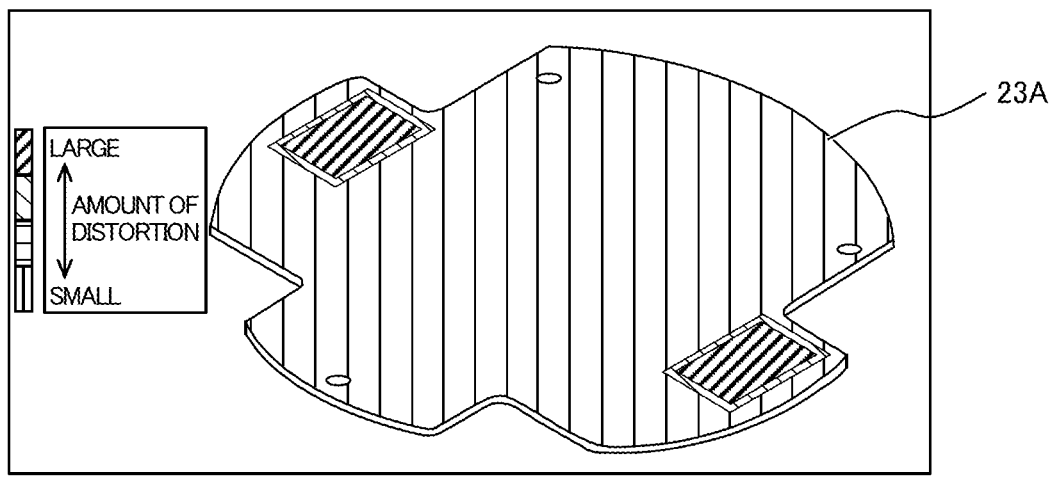
FIG. 6D is a perspective view of the power board illustrating an analysis result of the deflection amount when there is no anti-deflection structure.

FIG. 6D is a perspective view of the power board illustrating an analysis result of the deflection amount when there is no anti-deflection structure.

In the present embodiment, the electronic components and the power terminal 103 are symmetrically arranged on the mounting surface in a direction perpendicular to the straight line L23 from the axial center position O of the power board 23, and the back surface side of the first power terminal mounting portion R1D and the second power terminal mounting portion R2D on the power board 23 is brought into contact with the basic substance (casing) 21. That is, the first power terminal 101-1 and the second power terminal 101-2 are arranged symmetrically with respect to the straight line L23 on the mounting surface in the direction perpendicular to the straight line L23, which passes through the axial center position O of the power board 23 and is parallel to a board surface of the power board 23, and is parallel to the board surface, and the back surface side of the first power terminal mounting portion R1D and the second power terminal mounting portion R1D on the power board 23 is brought into contact with the basic substance 21 that supports the power board 23. For this purpose, the basic substance 21 is provided with a convex portion 21F that comes into contact with the back surface side of the first power terminal mounting portion R1D and the second power terminal mounting portion R2D on the power board 23.

That is, the basic substance 21 includes a second convex portion 21F that comes into contact with a part of the back surface of the power board 23 that is located directly below the mounting portion on which the first power terminal (power terminal of the first system) is mounted, and a third convex portion 21F that comes into contact with a part located directly below the mounting portion on which the first power terminal (power terminal of the second system) is mounted.

A terminal on the external power supply side is inserted into the power terminal 103 with a strong force from the upper side to the lower side. The power board 23 is distorted by receiving this strong force via the power terminal 103. In the structure provided with the convex portion 21F of FIG.

6C, the amount of distortion of the power board 23 is suppressed when external power terminals are joined, as compared with a structure that is not provided with the convex portion 21F in FIG. 6D.

In the present embodiment, the board anti-deflection structure (convex portion 21F) can be provided on the outer peripheral portion of the power board 23 by making the power terminal 103 distant from the motor center (that is, the axial center position O), and the deflection (distortion) of the power board 23 can be reduced. As a result, it is possible to eliminate the need for screw fixing in the vicinity of the power terminal 103, and the mounting efficiency of the power board 23 is improved. Note that the magnetic sensor (rotation angle sensor) 104 is mounted at the axial center position O in the power board 23, and thus, it is difficult to provide the board anti-deflection structure.

Further, in the present embodiment, for the same purpose as the convex portion 21F, the convex portion 21E that comes into contact with the back surface is also provided on the back surface side of the board-to-board connector mounting portion R3 where the board-to-board connector 105 is arranged. That is, the basic substance 21 has a fourth convex portion that comes into contact with a part of the back surface of the power board 23 that is located directly below the mounting portion on which the board-to-board connector 105 is mounted.

Figure 7:
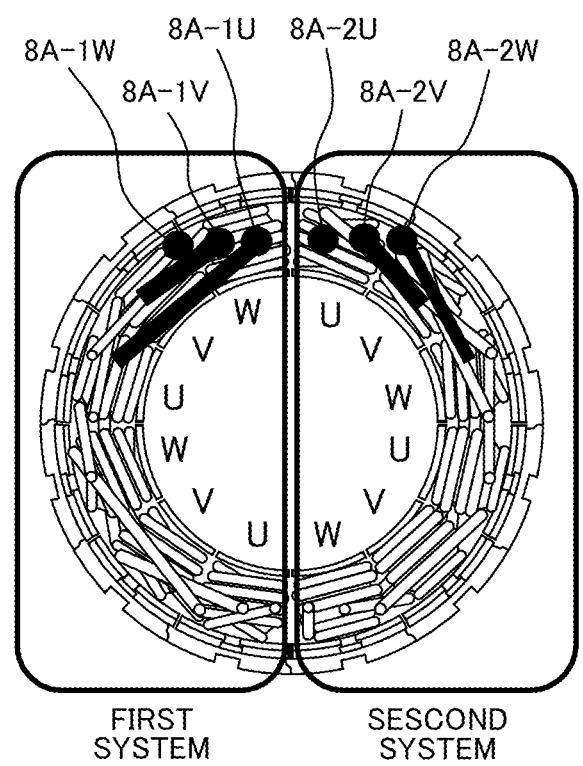
FIG. 7 is a conceptual diagram for describing end treatment of a coil wire.
Figure 8:
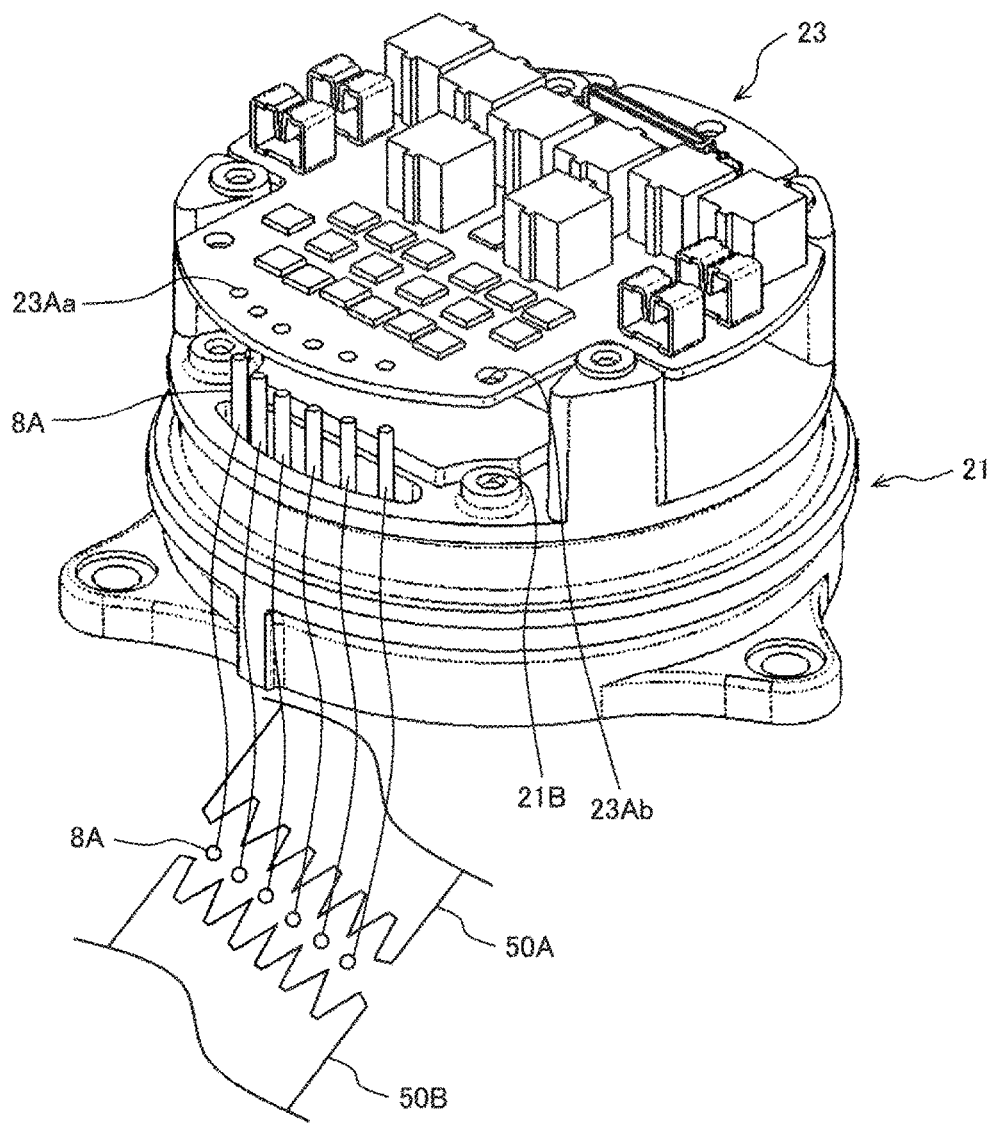
FIG. 8 is a view illustrating a comb-shaped jig used for the end treatment of the coil wire.

FIG. 7 is a conceptual diagram for describing end treatment of a coil wire. FIG. 8 is a view illustrating a comb-shaped jig used for the end treatment of the coil wire.

Coil wires of two systems are collectively wired for each system and corrected inside of the electric motor such that ends of the coil wires become straight in the same row, the insertion holes 23Aa on the power board 23 side can be integrated, and the product size can be reduced.

When the coil wires are corrected inside the electric motor and pulled out to the power board 23 side, the coil wires deteriorate in dimensional position accuracy due to the reaction of the coil wires, and thus, are hardly connect to the power board 23. Therefore, even the coil wires corrected inside the electric motor can be inserted into the insertion holes 23Aa of the power board 23 by fixing positions of the coil wires with comb-shaped jigs 50A and 50B. Note that a component having a coil guide function may be attached to the motor housing, in addition to the comb-shaped jig.

In the embodiment according to the present invention, the following assembly method can be implemented as a method for assembling the electronic control unit.

A method for assembling the electronic control unit 9, the electronic control unit 9 including:

the power board 23 that includes the first insertion hole portion RIA having the plurality of holes 23Aa-2U, 23Aa-2V, and 23Aa-2W through which the coil wires 8A-1U, 8A-1V, and 8A-1W of the first system are inserted and the second insertion hole portion R2A having the plurality of holes 23Aa-2U, 23Aa-2V, and 23Aa-2W through which the coil wires 8A-2U, 8A-2V, and 8A-2W of the second system are inserted;

the control board 25 provided on the upper part of the power board 23; and the board-to-board connector 105 that electrically connects the power board 23 and the control board 25, the first insertion hole portion R1A and the second insertion hole portion R2A being collectively arranged on the same side of the power board 23, the method including:

wiring the coil wires 8A-1U, 8A-1V, 8A-1W, 8A-2U, 8A-2V, and 8A-2W of the two systems collectively for each of the systems;

correcting ends of the coil wires 8A-1U, 8A-1V, 8A-1W, 8A-2U, 8A-2V, and 8A-2W inside the electric motor to be straight in the same row; and performing an assembly by inserting the core wires through the plurality of holes 23Aa-2U, 23Aa-2V, and 23Aa-2W of the first insertion hole portion R1A and the plurality of holes 23Aa-2U, 23Aa-2V, and 23Aa-2W of the second insertion hole portion R2A.

Note that the present invention is not limited to the above-described embodiment, but includes various modifications.

For example, the above-described embodiment has been described in detail in order to describe the present invention in an easily understandable manner, and is not necessarily limited to one including the entire configuration thereof. Further, a part of the configuration of the embodiment can be replaced with another configuration, and another configuration can be added to a part of the configuration of the embodiment.

REFERENCE SIGNS LIST 1 power steering device
8A-1U, 8A-1V, 8A-1W coil wire (coil lead wire) of first system
8A-2U, 8A-2V, 8A-2W coil wire (coil lead wire) of second system
9 electronic control unit
23 power board
23Aa-2U, 23Aa-2V, 23Aa-2W coil wire insertion hole of first system
23Aa-2U, 23Aa-2V, 23Aa-2W coil wire insertion hole of second system
25 control board
105 board-to-board connector
R1A first insertion hole portion
R2A second insertion hole portion

The invention claimed is:

1. An electronic control unit comprising:
a power board that includes a first insertion hole portion having a plurality of holes through which coil wires of a first system are inserted and a second insertion hole portion having a plurality of holes through which coil wires of a second system are inserted;
a control board provided on an upper part of the power board and electrically connected to the power board; and
a basic substance which is made of metal and to which the power board and the control board are fixed,
wherein the first insertion hole portion and the second insertion hole portion are collectively arranged on an identical side of the power board;
wherein
the power board includes a board-to-board connector configured for an electrical connection with the control board,
the board-to-board connector is provided on a side opposite to the first insertion hole portion and the second insertion hole portion with a center of the control board interposed between the board-to-board connector, and the first insertion hole portion and the second insertion hole portion; and a switching element of the first system, a switching element of the second system, a capacitor of the first system, a capacitor of the second system, a power terminal of the first system, and a power terminal of the second system, wherein the coil wires of the first system, the switching element of the first system, the capacitor of the first system, and the power terminal of the first system are sequentially mounted on the power board, and the coil wires of the second system, the switching element of the second system, the capacitor of the second system, and the power terminal of the second system are sequentially mounted on the power board.

2. The electronic control unit according to claim 1, further comprising an FS relay and a power choke coil, wherein high heat generating components including the switching element are arranged on an upper surface side of the power board, and low heat generating components such as the FS relay and the power choke coil are arranged on a lower surface side of the power board.

3. The electronic control unit according to claim 1, wherein the basic substance has a first convex portion that comes into contact with a part of a back surface of the power board that is located directly below a mounting portion on which high heat generating components including the switching element are mounted.

4. The electronic control unit according to claim 1, wherein on a mounting surface in a direction that is perpendicular to a straight line, which passes through an axial center position of the power board and is parallel to a board surface of the power board, and is parallel to the board surface, the power terminal of the first system and the power terminal of the second system are arranged symmetrically with respect to the straight line, and a back surface side of a mounting surface of the power terminal of the first system and a mounting surface of the power terminal of the second system on the power board is brought into contact with the basic substance supporting the power board.

5. The electronic control unit according to claim 1, wherein the basic substance includes a second convex portion that comes into contact with a part of a back surface of the power board that is located directly below a mounting portion on which the power terminal of the first system is mounted, and a third convex portion that comes into contact with a part of the back surface of the power board located directly below a mounting portion on which the power terminal of the second system is mounted.

6. An electronic control unit comprising:

a power board that includes a first insertion hole portion having a plurality of holes through which coil wires of a first system are inserted and a second insertion hole portion having a plurality of holes through which coil wires of a second system are inserted;

a control board provided on an upper part of the power board and electrically connected to the power board; and a basic substance which is made of metal and to which the power board and the control board are fixed, wherein the first insertion hole portion and the second insertion hole portion are collectively arranged on an identical side of the power board;

wherein the power board includes a board-to-board connector configured for an electrical connection with the control board, the board-to-board connector is provided on a side opposite to the first insertion hole portion and the second insertion hole portion with a center of the control board interposed between the board-to-board connector, and the first insertion hole portion and the second insertion hole portion; and wherein the basic substance has a fourth convex portion that comes into contact with a part of a back surface of the power board that is located directly below a mounting portion on which the board-to-board connector is mounted.

7. An electronic control unit comprising:

a power board that includes a first insertion hole portion having a plurality of holes through which coil wires of a first system are inserted and a second insertion hole portion having a plurality of holes through which coil wires of a second system are inserted;

a control board provided on an upper part of the power board and electrically connected to the power board; and a basic substance which is made of metal and to which the power board and the control board are fixed, wherein the first insertion hole portion and the second insertion hole portion are collectively arranged on an identical side of the power board;

wherein the power board includes a board-to-board connector configured for an electrical connection with the control board, the board-to-board connector is provided on a side opposite to the first insertion hole portion and the second insertion hole portion with a center of the control board interposed between the board-to-board connector, and the first insertion hole portion and the second insertion hole portion; and a magnetic sensor mounted between the first insertion hole portion and the second insertion hole portion, and a mounting portion of the board-to-board connector.

\* \* \* \* \*